United States Patent [19]

Champagne et al.

[11] Patent Number: 4,980,802
[45] Date of Patent: Dec. 25, 1990

[54] FLEXIBLE PRINTED CIRCUIT

[75] Inventors: Daniel Champagne, Septeuil; Alain Le Loc'h, Versailles; Olivier Lefort, Vernon, all of France

[73] Assignee: Bull CP8, Trappes, France

[21] Appl. No.: 346,134

[22] Filed: May 2, 1989

[30] Foreign Application Priority Data

May 9, 1988 [FR] France ................................ 88 06201

[51] Int. Cl.⁵ .............................................. H05K 1/18
[52] U.S. Cl. .................................... 361/401; 235/488; 235/492; 361/406; 361/408; 361/409
[58] Field of Search ............... 235/487, 488, 492, 493; 361/398, 401, 406, 408, 409, 412

[56] References Cited

U.S. PATENT DOCUMENTS

| | | | |
|---|---|---|---|
| 4,587,413 | 5/1986 | Hoppe et al. | 235/492 |
| 4,697,073 | 9/1987 | Hara | 235/492 |
| 4,725,924 | 2/1988 | Juan | 235/492 |
| 4,727,246 | 2/1988 | Hara et al. | 361/398 |
| 4,774,633 | 9/1988 | Dehaine et al. | 361/398 |
| 4,797,542 | 1/1989 | Hara | 235/492 |
| 4,835,846 | 6/1989 | Juan et al. | 361/398 |

FOREIGN PATENT DOCUMENTS 0207853 1/1987 European Pat. Off. .
87716 9/1966 France .

OTHER PUBLICATIONS

Parker, S. P., ed. *McGraw-Hill Dictionary of Scientific and Technical terms,* 3rd ed. (McGraw-Hill, New York, 1984) pp. 620 and 1271.
Jay, F., ed. *IEEE Standard Dictionary of Electrical and Electronics Terms,* (IEEE, New York, 1977) pp. 526-527.

*Primary Examiner*—Gregory D. Thompson
*Attorney, Agent, or Firm*—Wolf, Greenfield & Sacks

[57] ABSTRACT

A flexible printed circuit having contacts and associated leads which are connected to the contacts. The contacts are disposed at a first zone and the leads are for connection from this zone to a second zone of the circuit which is at a distance from the first zone. The leads run from the respective contacts substantially perpendicular to the axis of the printed circuit which connects the two zones. The leads in turn form bends or loops in relation to the axis, up to the second zone.

17 Claims, 2 Drawing Sheets

FLEXIBLE PRINTED CIRCUIT

BACKGROUND OF THE INVENTION

1. Field of the Invention

The present invention relates in general to a flexible printed circuit and pertains, more particularly, to a flexible printed circuit that supports electronic microcircuits for use in a card whose thickness meets the International Standard Organization (ISO) standard for credit cards.

2. Description of Prior Art

A card with electronic microcircuits is a single piece or multilayer rectangular card, made of plastic material. The card has contacts on an exterior surface for connection of the electronic microcircuits (integrated circuit chip) with a device for the processing of the card. These microcircuits may be designed for a variety of different uses, such as, for example, bank debit and credit transactions, the allocation of telephone systems, and confidential access in a protected environment. These cards generally have one or more complex processing and/or memory circuits, depending on the use for which they are intended. In practice, the electronic microcircuits may be comprised of at least one silicon wafer, typically referred to as an integrated circuit or circuit chip.

One form of a card construction is one in which the card is provided with a cavity in which is supported a printed circuit which carries the integrated circuit and, furthermore, carries card contacts. The printed circuit is typically made from a thin sheet of flexible material, such as polyester, epoxy glass, or as well, a plastic material which has sufficient flexibility. Given the fact that the printed circuit, equipped with contacts and an integrated circuit, is to be contained in a card whose thickness, according to standards, is relatively thin, such as 0.762 mn±10%, the sheet for the printed circuit is to be thin, on the order of, for example, 130 micrometers. The flexible material for the sheet and its thinness realize an element which is compatible with the flexibility required by the ISO for cards of the credit card type.

The flexible printed circuit, on one side thereof, carries the integrated circuit, and on the other side thereof carries the card contacts. The contacts are, in this manner, placed at a position remote from the integrated circuit and are connected to terminals of the integrated circuit by leads which are disposed on one side of the flexible printed circuit sheet. For reasons of convenience, the side of the sheet on which the contacts are accessible is termed the upper or external side of the sheet, and the other side of the sheet is termed the lower or internal side thereof In addition, the axis which connects the card contacts and the integrated circuit is termed the circuit axis.

In accordance with one method of fabricating the flexible printed circuit, the leads and the contacts with which they are connected are disposed on the upper side of the sheet. The terminals of the integrated circuit are soldered to the corresponding ends of the leads, which are arranged overhanging a recessed opening in the sheet. The ends of the leads may be formed in a manner to facilitate their connection with the corresponding terminals on the integrated circuit. A flexible printed circuit constructed in this manner is thin due to the fact that the thickness of the integrated circuit is not added to the thickness of the sheet. This is accomplished primarily by disposing the integrated circuit in a through opening of the sheet.

According to another method of production of the flexible printed circuit, the side of the integrated circuit which is opposite to that which carries the terminals of the integrated circuit is the one which is mounted on the lower side of the sheet, and the terminals of the integrated circuit are therefore connected to the matching ends of the sheet leads by lead wires. This technique employs "wire bonding".

In the production of the flexible printed circuit, the circuit leads may be covered with a protective coating. Alternatively, it is advantageous to spread this coating over the entire side of the card, especially when the leads for the printed circuit run the risk of being located in proximity to, or in contact with, a magnetic strip on the card. It is difficult to lay the magnetic strip if it is not mounted on a homogeneous material. When the coating is employed, of course, in that case openings are provided in the coating in order to provide access to the contacts.

One variant method of production of the printed circuit involves constructing the leads on the lower side of the flexible sheet. The integrated circuit is soldered to the matching lead ends, while, on the other end, the contacts are accessible in recessed openings in the sheet. This variant does not require the use of a coating, but it has the problem of adding to the thickness of the sheet and of the integrated circuit.

Moreover, the staggering of the contacts with respect to the integrated circuit may be preferred for several reasons, especially the need to meet the standards for placement of the contacts on the center line of the card, near one of the shorter edges. Due to this arrangement, the integrated circuit may remain in a corner of the card where tortional and bending stresses are clearly less than at the area of the contacts. ISO standards also dictate that the contacts are to be six or eight in number, distributed in an equal manner in two rows parallel to one of the shorter edges of the card. In accordance with another ISO arrangement, the contacts should have a predetermined minimum surface, rectangular in shape. The leads ordinarily run from the contacts and are connected in a direct and compact fashion with the corresponding terminals of the integrated circuit.

In order to meet international standards, the card has to be capable of enduring, without damage, a given number of flexures, which are performed following one or the other of the center lines of the card. Given this requirement, it has been determined, that printed circuits with staggered contacts designed in the standard manner are generally deficient in meeting minimum standards. As a general rule, the flexures which take place in the direction of the circuit axis are the most damaging. This damage is characterized by breaks in the leads. Studies have, therefore, been undertaken in order to find the best metallurgy and the best method of production for leads. The results obtained have been determined to be unsatisfactory with regard to both quality and reliability.

Accordingly, it is an object of the present invention to provide a flexible printed circuit with the means to ensure the quality of the electrical connections between the contacts and the circuit terminals in a lasting manner, despite the stress created by flexing of the printed circuit.

SUMMARY OF THE INVENTION

To accomplish the foregoing and other objects, features, and advantages of the invention, there is provided a printed circuit for use in a card and in which the printed circuit mounts an integrated circuit and associated contacts. Leads connect at one end to the contacts which are disposed in a first zone. The other ends of the leads couple to a second zone which is at a distance from the first zone. The invention is characterized by the fact that the leads run from respective contacts and in a manner which is substantially perpendicular to the printed circuit axis where the connections are made at the two aforementioned zones. Furthermore, these leads form loops and bends in relation to the axis.

With the structure of the present invention the lengths of leads disposed in a straight line, parallel to the circuit axis, is substantially reduced. In this manner, when the circuit undergoes flexures, the bends give a certain freedom to the leads avoiding them being stretched and thus broken. It has been found that in the worst case, an excessive flexure may possibly entail the ungluing of one of the lead lengths between the contact and the integrated circuit terminal, but a break does not appear, so that electrical continuity is ensured.

The flexible printed circuit arrangement of the present invention is adapted to an installation in which the contacts are near the main center line of the card, in proximity to one of the shorter edges and in which the integrated circuit is likewise near one end of the card. This is illustrated in both the embodiments to be described in further detail hereinafter. However, the concepts of the present invention are also applicable to different installations, such as in the case where the contacts are quite close to the main center line and to one of the shorter edges of the card when the integrated circuit is close to the center of the card, on the main center line. In a more general manner, the invention is applicable to all possible installations in which the circuit axis is parallel to one edge of the card (longer or shorter) and in which the mounting of the contacts on the exterior may or may not satisfy the standards mandated for this field, or even other installations in which the circuit axis is no longer parallel to one or the other edge of the card.

A BRIEF DESCRIPTION OF THE DRAWINGS

Numerous other objects, features, and advantages of the invention should now become apparent upon a reading of the following detailed description taken in conjunction with the accompanying drawings in which.

DETAILED DESCRIPTION

Figure 1:
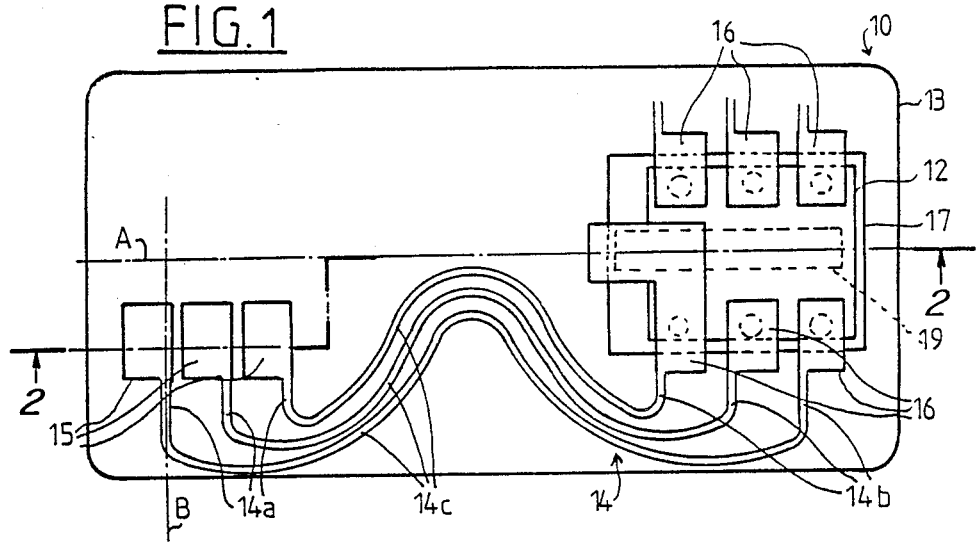
FIG. 1 is a top plan view of a first embodiment of a flexible printed circuit in accordance with the present invention.
Figure 2:
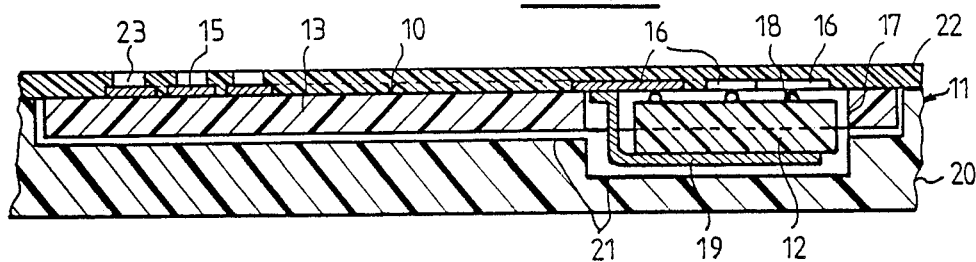
FIG. 2 is a cross-sectional view taken along line II—II of the flexible printed circuit illustrated in FIG. 1 and illustrating the circuit mounted inside of a card of the credit card type, which is partially illustrated.
Figure 3:
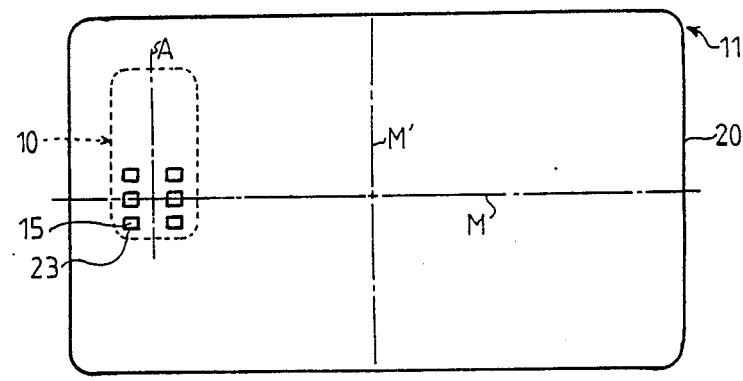
FIG. 3 is a top plan view of the entire card, a portion of which is shown in FIG. 2.

FIGS. 1-3 illustrate a flexible printed circuit 10 constructed in accordance with the principles of the present invention. The circuit 10 is illustrated for use in a card 11 of the credit card type. The card is of the type to be equipped with electronic microcircuits.

As illustrated in FIGS. 1 and 2, the electronic microcircuits are contained in an integrated circuit 12 which is mounted on the printed circuit 10. The printed circuit 10 is constructed from a rectangular, thin and flexible sheet 13, usually constructed of a plastic material. The upper side of the sheet 13 carries six leads 14, of which only three are totally illustrated for purposes of clarity. The leads 14 connect six contacts 15 to six corresponding tabs 16 which are arranged overhanging a recessed opening 17 in the sheet 13. The opening 17 contains the integrated circuit 12, whose terminals 18 are soldered to the respective tabs 16. In the embodiments illustrated the axis A which connects the zone where the contacts 15 are located to the zone where the tabs 16 are located, is aligned with the main center line of the sheet 13, thus, the axis A of the circuit is here the main center line. In addition, each zone is in proximity to one of the ends of the aforementioned center line.

In the cross-sectional fragmentary view of FIG. 2, the terminals 18 are directly soldered to the tabs 16 of the printed circuit. In an alternate arrangement which is not illustrated, the integrated circuit may be disposed so that the terminals 18 are facing downwardly. In this embodiment, the terminals 18 are therefore connected to the tabs 16 by means of lead wires.

The integrated circuit 12 illustrated in FIGS. 1 and 2 may be of the Metal Oxide Semiconductor (MOS) type. A polarization tab 19 is mounted on the back of the integrated circuit and is connected to an extension of one of the tabs 16. The opening 17 is placed at one end of the rectangular sheet 13 and has its axis aligned with the circuit axis A. The contacts 15 are placed in an area which is remote from the opening 17 and are placed on opposite sides of the axis A at the other end of the sheet 13. The contacts 15 are arranged in two parallel rows, each preferably equidistant from the axis A. Actually, the same type of spacing from the axis A is also provided for the tabs 16.

The contacts 15 and the conductive tabs 16 both have a rectangular shape. The widths of these members are generally orthogonal to the axis A. The leads 14 which connect the contacts 15 to the tabs 16 are thin and narrow in relation to the width of the contacts. For example, the leads 14 may have a width on the order of 300 micrometers.

An example of the manufacturing of an electronic microcircuit card 11 which contains the printed circuit 10 shown in FIG. 1 is illustrated in FIGS. 2 and 3. The card 11 is made of a plate 20 made of flexible material, whose dimensions meet ISO standards. The plate 20 is rectangular in shape, with a large center line M and a small center line M'. It may be a single piece as shown or multilayered. One side of the plate 20 has a cavity 21 which is suitable for housing the printed circuit 10, which is equipped with an integrated circuit 12 so that the upper side of the printed circuit 10 is noticeably coplanar with the corresponding side of the plate 20. The entirety of this side is then covered with a coating 22 with openings 23 in the area of the contacts 15 for their connection to an external processing device. As shown in FIG. 3, one ordinarily takes advantage of the printed circuit 10 by placing it in the card 11 in such a manner that the axis A is parallel to one of the shorter edges of the card and the contacts 15 are placed in the vicinity of that same edge, in its middle zone. In the example shown, the contacts 15 which are accessible by means of the openings 23 are distributed from one end to the other of the large center line M of the card.

Now, in accordance with the invention, the leads 14 are illustrated particularly as in FIG. 1 as shown running from respective contacts 15 perpendicularly to the axis A of the printed circuit 10, and then form bends or loops in relation to the axis A. More particularly, each lead 14 has a one portion 14a adjacent to the respective contact 15 and extending in a direction B which is substantially orthogonal or perpendicular to the axis A. At the other end of the lead there is a portion 14b, that interconnected by portion 14c. The portion 14b abuts the corresponding tab 16 and extends in a direction which is also substantially orthogonal or perpendicular to the axis A. But in middle portion 14c, each lead has at least one bend or loop therein in relation to the axis A. A bend or loop is understood to be a non-linear form which has no abrupt angles in the lead's track.

Straight segments of the leads 14, particularly in a direction parallel to the axis A are eliminated particularly in the areas about the contacts 15 and tabs 16, but also, with the loops and bends illustrated the lengths of the leads are thereby increased in relation to the direct path from the contacts 15 to the tabs 16. This makes it possible to compensate for the stretching which occurs during flexing, and prevents the leads from being broken. Furthermore, any angles in the path from the leads would be likely sites for breaks during flexures which would cause buckling at the angles. This is why the lengthening of the path of leads is induced by creating loops or bends which would not be likely breaking points.

Figure 4:
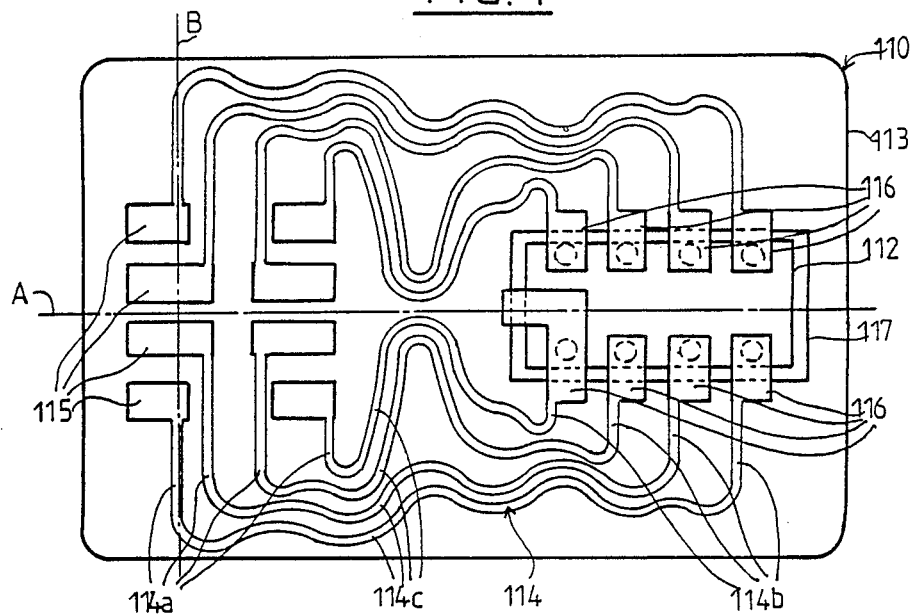
FIG. 4 is a top plan view of an alternate embodiment of the flexible printed circuit in accordance with the present invention.

FIG. 4 illustrates an alternate embodiment of the invention. In FIG. 4 there is illustrated the printed circuit 110 which carries the integrated circuit 112 and the contacts 115. The contacts 115 are arranged in two rows which are disposed as indicated by the axis B in a direction generally perpendicular to the axis A. The contacts 115 are in a first zone of the thin sheet 113. The connecting tabs 116 are located in a second zone of the sheet 113 which is remote from the first zone. The contacts 115 and the tabs 116 are both in proximity to the axis A as illustrated. Furthermore, in this embodiment the lengths of the individual contacts 115 are in parallel to the axis A of the sheet. The printed circuit 110 of FIG. 4 has elements which are reference 114, 114a, 114b, 114c, 115, 116, and 117. These elements respectively correspond to, and have substantially the same functions as, the elements referenced 14, 14a, 14b, 14c, 15, 16, and 17 in FIGS. 1 and 2.

Figure 5:
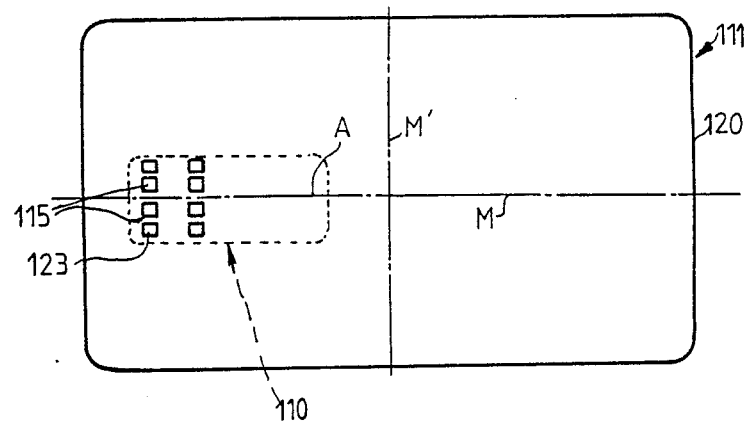
FIG. 5 is a top plan view of a card embodying the flexible printed circuit of FIG. 4.

In the embodiment of the invention illustrated in FIGS. 4 and 5 it is possible to, for example, maintain the standard for installation of the contacts 115 with respect to the card, that is to say, by arranging the rows essentially parallel to each other and to one of the shorter edges of the card. Also, this arrangement permits the integrated circuit 112 to be moved closer to the center of the card as illustrated.

In order to have all of the leads 114 run from the contacts 115 which is in a direction substantially perpendicular to the axis A, the inside contacts close to the axis A have a larger size and in particular a larger length than the outer contacts. The inner contacts 115 thus extend beyond the outer contacts as illustrated in FIG. 4, thus facilitating a connection of the leads portions 114a to the contacts, in a direction perpendicular to the axis.

Each lead 114 has a one portion 114a adjacent to the respective contact 115 and extending in a direction B which is substantially orthogonal or perpendicular to the axis A. At the other end of each lead, there is a portion 114b that is interconnected by a portion 114c. The portion 114b abuts the corresponding connecting tab 116 and extends in a direction which is also substantially orthogonal or perpendicular to the axis A. But in metal portion 114c, each lead has at least one bend or loop therein in relation to the axis A. An opening 117 is placed at one end of the rectangular sheet 113 and has its axis aligned with the circuit axis A. The contacts 115 are placed in an area which is remote from the opening 117 and are placed on opposite sides of the axis A at the other end of the sheet 113.

A card 111 which contains such a printed circuit 110 would have, viewed from above, the appearance shown in FIG. 5. In that case, the axis A of the printed circuit 110 would be combined with the large center line M of the card 111 and the contacts 115 would meet current standards. The plate 120 made of flexible material which constitutes the body of the card 111 could have the same structural characteristics as those illustrated in FIG. 3. In particular, it could be covered with a coating with openings 123 in the area of the contacts 115 for their connection with an external processing unit.

In the example shown in FIG. 5, the axis A of the printed circuit overlies the large center line M of the card, so that the integrated circuit 112 is near the center of the card and also on the large center line. It is, of course, possible to use the embodiment shown in FIG. 4 in every instance in which it would be necessary to place the contacts, for example, near a corner of the card, for any reason whatsoever, while observing the arrangement mandated by current standards, and the chip simultaneously near one of the longer edges and a small center line M' of the card, But it is clearly understood that the illustrations which have been given are not limitative in any way, and, in particular, a change in the standards for the arrangement of the contacts which requires that the rows not be any longer parallel to a shorter edge of the card, but rather parallel to a longer edge of the card, would for example, entail the use of the second embodiment so as to place the contact on the large center line and the chip in the corner or, as well, the first embodiment described might be used in order to position the contacts near one end of the large center line M of the card and the integrated circuit in proximity to the center of the card. Furthermore, it is noted that the contacts 115 may have either their width or their length disposed parallel to the axis A as indicated in FIGS. 1 or 4. In alternate embodiments of the invention the axis of the contacts could also be in other than parallel or perpendicular directions. Also, the contacts need not necessarily be rectangular.

Regardless of the embodiment selected for the placement of the integrated circuit and the contacts, it is desired to avoid placement of the a straight length of lead wire parallel to the axis A of the printed circuit.

The advantages of the invention are the following. According to the ISO standards in which, by convention, a card with electronic microcircuits must undergo without damage a predetermined number of flexures made along the large center line M of the card and the same number of flexures along the small center line M'. Experience reveals that flexures of the card which are made on the axis A of the printed circuit are immediately damaging when the printed circuit is made in the standard manner. Breaks occur in the areas of the printed circuit leads, which make all processing of the card impossible or erroneous. A great number of trials have been performed which varied the configuration and the metallurgy of the leads. The arrangement which conforms to the invention ensures in an optimal fashion the reliability of the electrical connection made by the leads in the card when it undergoes a great number of flexures along its two center lines M, M', and which have repercussions along the axis A of the printed circuit.

We claim:

1. A printed circuit comprising: conductive contacts; and conductive leads which are each connected to a respective contact at a first zone of the circuit, and which are each connected to a respective second contact in a second zone, said second zone of the circuit located at a distance from the first zone, each lead having means defining end portions that extend to a predetermined point from the respective contact in each of the first and second zones in a direction substantially perpendicular to an axis of the printed circuit defined as that axis extending between the first and second zones, and each lead also including means defining a middle portion contiguous with each of the end portions at the predetermined point, said middle portion having at least one bend or loop therein.

2. A printed circuit in accordance with claim 1, wherein the contacts are distributed in the first zone in two rows which are parallel to the axis of the printed circuit.

3. A printed circuit in accordance with claim 2, wherein the leads end in the second zone in a direction which is substantially perpendicular to the axis, and wherein each lead ends at a different tab located in said second zone.

4. A printed circuit in accordance with claim 1, wherein the contacts are distributed in the first zone in a uniform manner along the axis of the printed circuit.

5. A printed circuit in accordance with claim 4, wherein the leads end in the second zone in a direction which is substantially perpendicular to the axis, and wherein each lead ends at a different tab located in said second zone.

6. A printed circuit in accordance with claim 1, wherein the leads end in the second zone in a direction which is substantially perpendicular to the axis, and wherein each lead ends at a different tab located in said second zone.

7. A printed circuit in accordance with claim 6, wherein the tabs are distributed in the second zone in a uniform manner along the axis of the printed circuit.

8. A printed circuit in accordance with claim 6, further comprising an integrated circuit carried in the second zone and provided with terminals, each of the terminals being connected with one of the tabs.

9. A printed circuit in accordance with claim 8, wherein the integrated circuit is placed in an opening made in the second zone.

10. A printed circuit in accordance with claim 1, wherein the contacts in at least one of said first and second zones are distributed in two rows which are parallel to each other and which rows extend perpendicular to the axis of the circuit, thus placing some contacts closer to the said axis and some contacts further away from said axis and wherein said contacts which are closer to said axis have a dimension, parallel to the axis, which is larger than the corresponding dimension of the contacts which are further away from said axis such that all of the contacts are each accessible by a respective lead.

11. A printed circuit comprising: conductive contacts, and conductive leads, which are each connected to a respective contact at a first zone of the circuit, and which are each connected to a respective second contact in a second zone of the circuit, said second zone of the circuit located at a distance from the first zone, wherein each lead runs to a predetermined point from each respective contact it is connected to in a direction substantially perpendicular to an axis of a printed circuit defined as that axis extending between said first and second zones, said leads furthermore having bends or loops therein disposed between each predetermined point, and wherein the contacts in at least one of said first and second zones are distributed in two rows which are parallel to each other and which rows extend perpendicular to the axis of the circuit, thus placing some contacts closer to the said axis and some contacts further away from said axis, and wherein said contacts which are closer to said axis have a dimension, parallel to the axis, which is larger than the corresponding dimension of the contacts which are further away from said axis such that all of the contacts are each accessible by a respective lead.

12. A printed circuit in accordance with claim 3, wherein the leads end in the second zone in a direction which is substantially perpendicular to the axis, and wherein each lead ends at a different tab located in said second zone.

13. A card having an electronic microcircuit thereon, said microcircuit being a printed circuit comprising: conductive contacts; and conductive leads which are each connected to a respective contact at a first zone of the circuit, and which are each connected to a respective second contact in a second zone, said second zone of the circuit located at a distance from the first zone, each lead having means defining end portions that extend to a predetermined point from the respective contact in each of the first and second zones in a direction substantially perpendicular to an axis of the printed circuit defined as that axis extending between the first and second zones, and each lead also including means defining a middle portion contiguous with each of the end portions at the predetermined point, said middle portion having at least one bend or loop therein.

14. A card in accordance with claim 13, wherein: the card is substantially quadrilateral in shape, the quadrilateral shape having first and second center lines substantially perpendicular to each other; the axis is parallel to the first center line of the card; and the contacts are located in the vicinity of the second center line of the card.

15. A card in accordance with claim 13, wherein: the card is of a substantially rectangular shape having two perpendicular center lines of different length; the axis is substantially parallel to the shorter edges of the card and to the shorter center line; and the contacts are located in the vicinity of the longer center line of the card, near one of its ends.

16. A card in accordance with claim 13, wherein: the card is of substantially rectangular shape having two perpendicular center lines of different length; the axis overlies the longer center line of the card; and the contacts are in proximity to one end of the longer center line.

17. In combination, a card and a flexible printed circuit supported within the card and having contacts which are disposed in a first zone of the circuit and a circuit chip which is disposed in a second zone of the circuit spaced from said first zone, the printed circuit comprising: conductive leads intercoupling the contacts and the circuit chip, said conductive leads having ends thereof located at each of the contacts and circuit chip and extending from each of said ends to predetermined points in a direction substantially orthogonal to an axis of the printed circuit that extends between said zones, said leads having bends or loops therein between said predetermined points, wherein the contacts are distributed in two rows which are parallel to each other and perpendicular to the axis of the circuit, and wherein the inner disposed contacts are longer than the outer disposed contacts of each row to facilitate a perpendicular connection of the conductive leads and contacts.

* * * * *